(12) United States Patent
Schillings et al.

(10) Patent No.: US 6,744,422 B1
(45) Date of Patent: Jun. 1, 2004

(54) VARIABLE TIME-OUT FOR MULTI-TAP KEY ENTRY

(75) Inventors: Benoit Schillings, Palo Alto, CA (US); Tom R. Vandermeijden, Pacifica, CA (US)

(73) Assignee: Openwave Systems Inc., Redwood City, CA (US)

( * ) Notice: Subject to any disclaimer, the term of this patent is extended or adjusted under 35 U.S.C. 154(b) by 446 days.

(21) Appl. No.: 09/905,629

(22) Filed: Jul. 13, 2001

(51) Int. Cl.$^7$ ................................................. G09G 5/00
(52) U.S. Cl. ........................... 345/169; 345/172; 341/22
(58) Field of Search ................................. 345/168, 169, 345/172; 341/22, 23, 26; 379/368

(56) References Cited

U.S. PATENT DOCUMENTS

| | | | | |
|---|---|---|---|---|
| 5,007,008 A | * | 4/1991 | Beers | ........................ 708/145 |
| 6,130,628 A | * | 10/2000 | Schneider-Hufschmidt et al. | .......... 341/26 |
| 6,295,052 B1 | * | 9/2001 | Kato et al. | ................... 345/179 |
| 6,378,234 B1 | * | 4/2002 | Luo | ............................. 341/22 |

* cited by examiner

Primary Examiner—Regina Liang
(74) Attorney, Agent, or Firm—Blakely, Sokoloff, Taylor & Zafman LLP

(57) ABSTRACT

A system and method of determining a dynamic cursor advance time delay for a multi-tap key is disclosed. First, an elapsed time between a selection of a first key and a selection of a second key is measured. The measured elapsed time is then compared to a current cursor advance time delay. The current cursor advance time delay is then adjusted. In one embodiment, measuring the elapsed time between the selection of the first key and the selection of the second key includes averaging the elapsed time with previously recorded elapsed times.

26 Claims, 11 Drawing Sheets

VARIABLE TIME-OUT FOR MULTI-TAP KEY ENTRY

FIELD OF THE INVENTION

The present invention relates to keyboard data entry methods and more particularly to a method an apparatus for entering data in keyboards with multi-tap keys.

BACKGROUND OF THE INVENTION

Multi-tap keyboards are typically used in reduced keyboard applications such as telephones, pagers, personal digital assistants (PDAs) and any other device that has a keyboard or keypad with keys that have more than one function. For example, a typical telephone or cellular telephone includes a 12-key keyboard, keys "1–9", "0", "*" and "#". Typically, keys "2–9" also include the alphabetical characters. Keys "2–9" are therefore multiple function/character keys. For example, typically the number "2" key also includes the letters "A", "B" and "C". Often a user desires to enter alphabetical data into the telephone such as for storing a name and a telephone number into a memory portion of the telephone. Large amounts of alphabetical data can often be required when the telephone is used to access the Internet, because the user must enter desired Internet addresses and other data on a selected Internet web site, such as personal and/or financial information when placing an order.

One type of multiple function/character keyboard is a multi-tap keyboard. FIG. 1 shows one method 100 of using a multi-tap keyboard. First a selected multi-tap key is pressed in block 104. Pressing a key starts a timer and displays the first character of the multi-tap key. For example, on the first press of the "2, A, B, C" key, a "2" is displayed. Next, if the displayed character "2" is not the desired character, then the timer is checked in block 110. If the timer has expired, i.e. a cursor advance time delay has elapsed, then the displayed character is output in block 140 as the desired character and the cursor is advanced to the next character position. If the cursor advance time delay has not elapsed in block 110, and then the selected multi-tap key is pressed again in block 112, then the cursor advance time delay is reset and restarted and the subsequent character "A" is displayed in block 114. Next, the displayed character is examined again in block 108. Alternatively, the displayed character can also be a selected function and when the cursor advance time delay has expired the selected function is automatically executed.

Returning to block 108, if the displayed character "A" is the desired character, then the cursor advance time delay is checked in block 120. If the cursor advance time delay has elapsed, then the displayed character is output in block 140 and the cursor is advanced to the next character position.

For example, returning to the above example of the "2, A, B, C" key, first pressing the "2, A, B, C" key results in the "2" being displayed. If "2" is the desired character, then when the cursor advance time delay has elapsed, the "2" will be output and the cursor advanced to the next character position. If the "2" is not the desired character, and, before the cursor advance time delay has elapsed, the "2, A, B, C" key is pressed yet again the "A" is displayed. If the "A" is the desired character, then when the cursor advance time delay has elapsed, the "A" will be output and the cursor advanced. If the "A" is not the desired character and, before the cursor advance time delay has elapsed, the "2, A, B, C" key is pressed yet again and the "B" is displayed. If the "B" is the desired character, then when the cursor advance time delay has elapsed, the "B" will be output and the cursor advanced. If the "B" is not the desired character, and, before the timer expires, the "2, A, B, C" key is pressed yet again and the "C" is displayed. In many multi-tap systems, repeating the above-described process once more repeats the process of step;ping through the "2, A, B, C" sequence as described above.

The cursor advance time delay described above is typically set to approximately 1.5 seconds. 1.5 seconds provides sufficient time for an average user to decide whether the displayed character is the desired character or not. Unfortunately, this default time also limits the absolute "typing" or data entry speed on a multi-tap keyboard to approximately 1.5 seconds per keystroke. For users that have faster data-entry abilities, this 1.5 seconds per keystroke reduces the user friendliness and usefulness of the multi-tap device.

SUMMARY OF THE INVENTION

A system and method of determining a dynamic cursor advance time delay for a multi-tap key is disclosed. First, an elapsed time between a selection of a first key and a selection of a second key is measured. The measured elapsed time is then compared to a current cursor advance time delay. The current cursor advance time delay is then adjusted. In one embodiment, measuring the elapsed time between the selection of the first key and the selection of the second key includes averaging the elapsed time with previously recorded elapsed times.

In one embodiment the dynamic cursor advance time improves a user interface by substantially eliminating the requirement for a user to wait for a multi-tap key cursor advance delay because the delay is automatically adjusted to the user's own personal multi-tap key data entry speed.

BRIEF DESCRIPTION OF THE DRAWINGS

The present invention is illustrated by way of example and not limitation in the figures of the accompanying drawings in which like references indicate similar elements.

DETAILED DESCRIPTION

A system and method of substantially eliminating multi-tap key, data entry delays is described. In one embodiment the automatic cursor advance delay is adjusted to substantially match the user's own personal multi-tap key data entry speed. Adjusting the cursor advance delay increases the utility of the multi-tap key data entry user interface by matching the data entry speed to the user's own speed, whether the user's data entry speed is slower or faster than a arbitrary "normal" data entry speed. The multi-tap key data entry method is used in a large variety of devices and the improvement described herein is applicable to any devices that includes a multi-tap key for data entry or selection, such as mobile telephones, PDAs, and two-way pagers.

Figure 1:
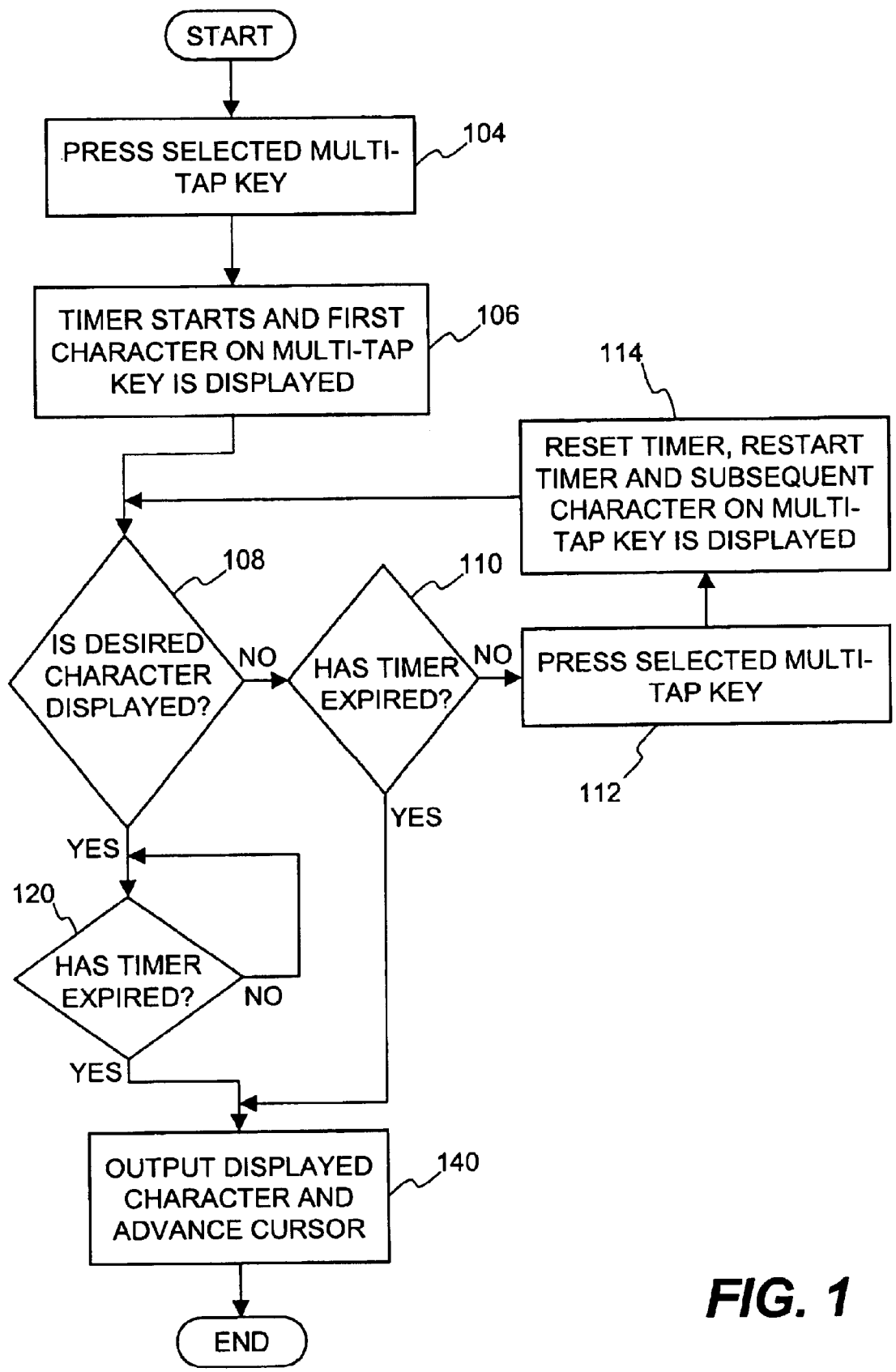
FIG. 1 shows a prior art method of using a multi-tap keypad.
Figure 2:
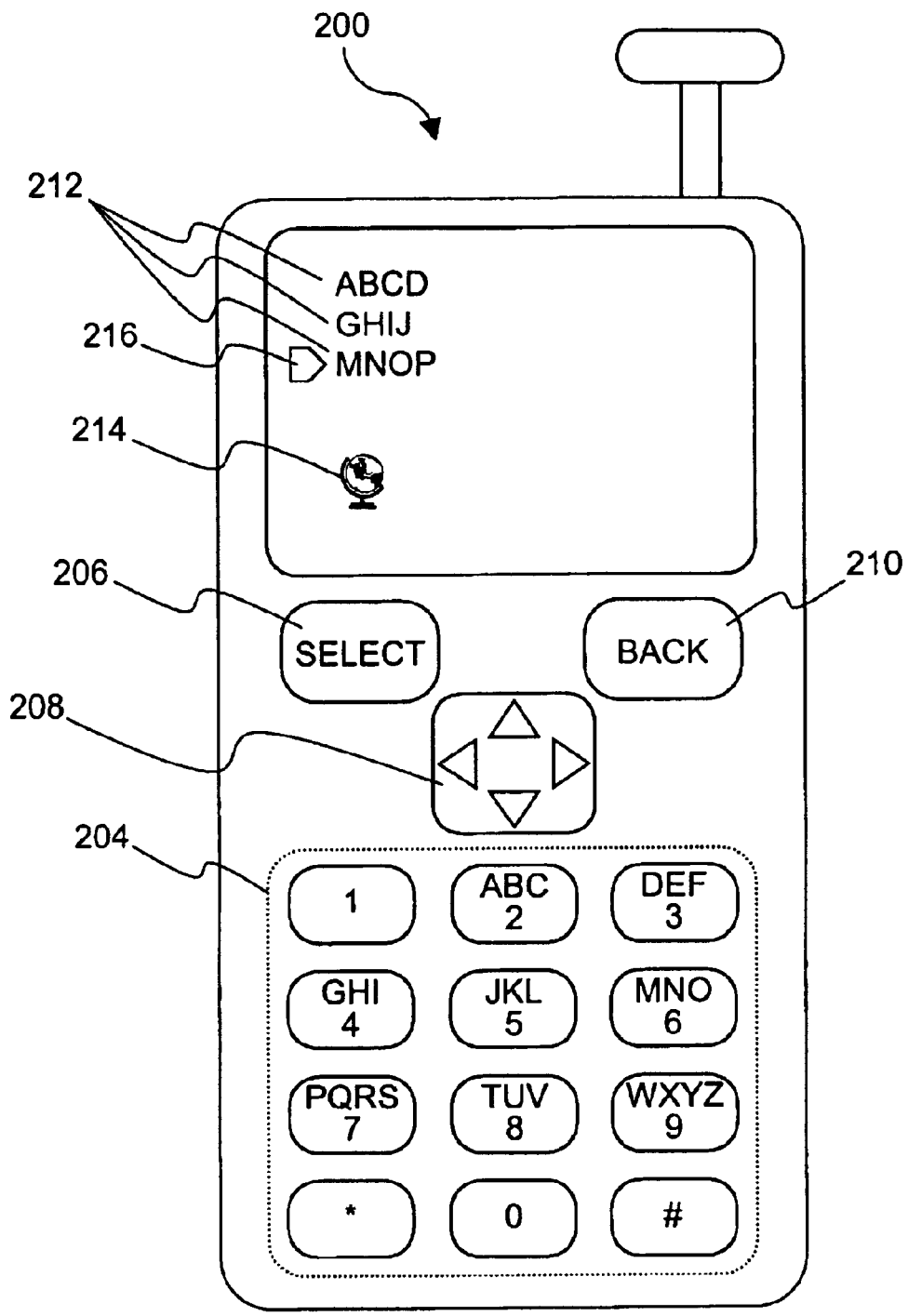
FIG. 2 illustrates a wireless device used as a mobile user terminal.

FIG. 2 illustrates one example of a web-enabled cellular telephone 200 that can be used as a mobile user terminal to access a desired web page on the Internet. The web-enabled cellular telephone 200 includes a display screen 202, an alphanumeric, multi-tap keypad 204 and navigational buttons 206, 208, 210. As shown, the display screen 202 displays a page of information. The page includes data elements including text 212, an icon 214 and a cursor 216. Each one of the data elements 212, 214 on the displayed page, is typically a link or hyperlink to another page of information or an address or phone number or other data. The data elements 212, 214 can alternatively link to applications such as email or a phonebook or an addressbook or other applications. The multi-tap keypad 204 includes several keys (i.e. keys "1–9", "0", "*" and "#") for data entry. The navigation buttons 206, 208, 210 include a select button 206, a cursor movement button 208 and a back navigational button 210. The cursor movement button 208 allows a user to move the cursor 216 from one text entry 212 or icon 214 to the next. The select button 206 activates the selected the text entry 212 or icon 214 that was selected by the cursor 216. The back navigational button 210 causes a page that was displayed immediately before the currently displayed page to be displayed on the screen 202.

A mobile telephone is one possible example that is used to describe the present invention however the present invention is not limited to mobile telephones. The technique described herein may be used in any type of electronic device that includes a multi-tap keypad or keyboard such as handheld personal computers, personal computers, laptop personal computers, pagers, personal digital assistants (PDAs), telephones, or any similar electronic devices.

One problem associated with using a device with a multi-tap keypad such as shown in FIG. 2, to access the Internet (or Intranets or any other application requiring more than a few data entry keystrokes), is related to the lack of user-friendliness of the user interface associated with such devices. Typically, multi-tap keypad devices have compact keypads with few keys (e.g. 3–30 keys) and small size, reduced resolution, monochrome or limited color displays. Further, mobile devices communicate using wireless channels that typically have only a fraction of the speed and capacity of the communication channels used by personal computers to access to the Internet (or an Intranet) or other networks. These restrictions exist because most multi-tap keypad devices are for mobile uses and therefore must be able to fit into the palm of the hand or in a pocket and must also be relatively inexpensive.

For any user terminal to gain a wide spread use, the user terminal must meet the needs of the intended users. Specifically, any interface used to interact with the Internet (or Intranets or any other application requiring more than a few data entry keystrokes) must be interactive and easy to use. Users expect to be able to easily access information and users expect the accessed information to be presented in an efficient manner, which leverages the resident computing power of the user terminal and the network computers.

One example of entering data into a multi-tap keypad device is using such a device to enter text such as messages or when accessing the Internet. Accessing information on the Internet (or Intranets). Accessing information on the Internet (or Intranets) sometimes requires the user to enter the location (e.g. a Uniform Resource Locator (URL)) for the desired information or to utilize a search engine to access the desired information. Quite frequently the desired information may be distributed across more than one web page. This might require the user to enter the URL for each web page to access the desired information or enter the search data into the search engine. For example, if a user is making travel arrangements he might first access a search engine, either by entering the URL for the search engine or selecting a link to the search engine and then entering the search data in to the search engine. Next, the user enters or selects a URL to a flight reservation page to find a flight, and enters the desired flight and passenger information. Then the user enters a URL or selects a link to another page to purchase the tickets and enter payment information (credit card, address, telephone, etc). Next the user enters or selects a URL for a third page to reserve a hotel room. Again the user enters the appropriate reservation, scheduling, personal, and payment data. The user may continue performing additional tasks on the Internet including reserving a rental car, making dinner reservations, ordering tickets to an event or other shopping, etc. Accessing multiple pages is not a difficult task using a computer without a multi-tap keypad, but entering all of the required URLs, search data, scheduling data, personal data, payment data and other data with a multi-tap keypad device is considerably more time consuming and can be very tedious.

Figure 3:
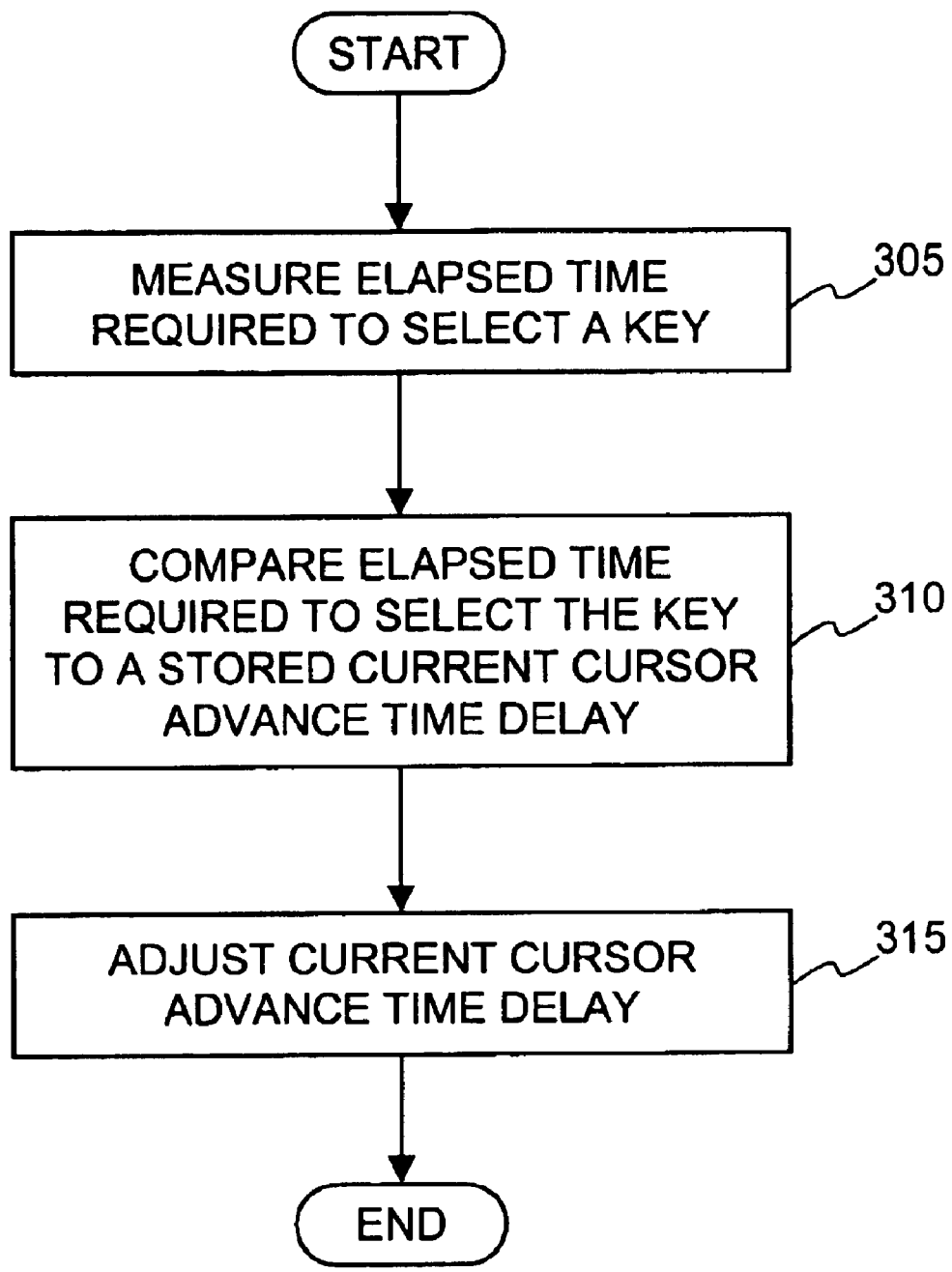
FIG. 3 illustrates one embodiment of a process for dynamically varying a multi-tap, cursor advance time delay.

FIG. 3 illustrates one embodiment of a process for dynamically varying a multi-tap, cursor advance time delay. Dynamically varying a cursor advance time delay can be performed in any device such as any device that has a multi-tap keypad. In another embodiment, the process of dynamically varying a cursor advance time delay can be performed in a device that is remotely linked to the device that has a multi-tap keypad. First, in block 305, the time required for a user to select a key on a multi-tap keypad is measured. Next, the measured time is compared to a current cursor advance time delay in block 310. Then, the current cursor advance time delay is automatically adjusted in block 315. The process described in FIG. 3 automatically adjusts the cursor advance time delay to substantially match an individual user's typing/data entry speed so as to improve the data entry process. The data entry process is improved by reducing delays when the delay is too long for the user and by increasing the delay when the delay is too short for the user.

Figure 4:
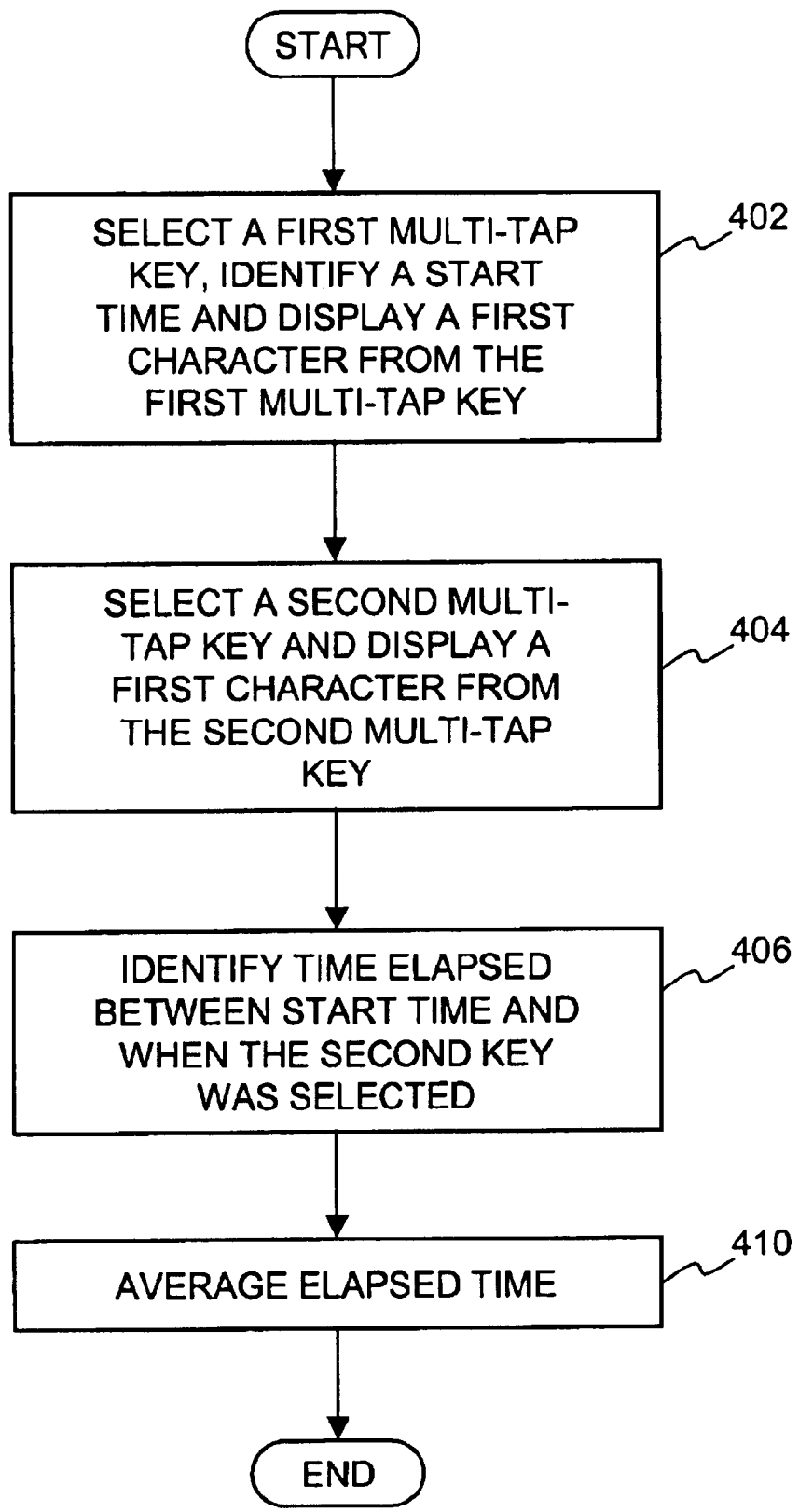
FIG. 4 shows one embodiment of measuring the time required for a user to press a key on a multi-tap keypad.

FIG. 4 shows one embodiment of measuring the time required for a user to select a key on a multi-tap keypad. First, the user selects a first multi-tap key in block 402. When the multi-tap key is selected, a start time on a cursor advance timer is recorded or alternatively, the cursor advance timer could be started. A first character that corresponds to the first multi-tap key can also be displayed. Next, a second key is selected in block 404. The elapsed time on the cursor advance timer is recorded and a first character that corresponds to the second key can also be displayed. In block 406, the elapsed time indicated by the cursor advance timer is determined. The elapsed time is the averaged to determine an average elapsed time in block 410. In one embodiment, the average elapsed time is equal to the total elapsed time between each two key selections of the multi-tap keypad divided by one less than a number of the key selections.

Figure 5:
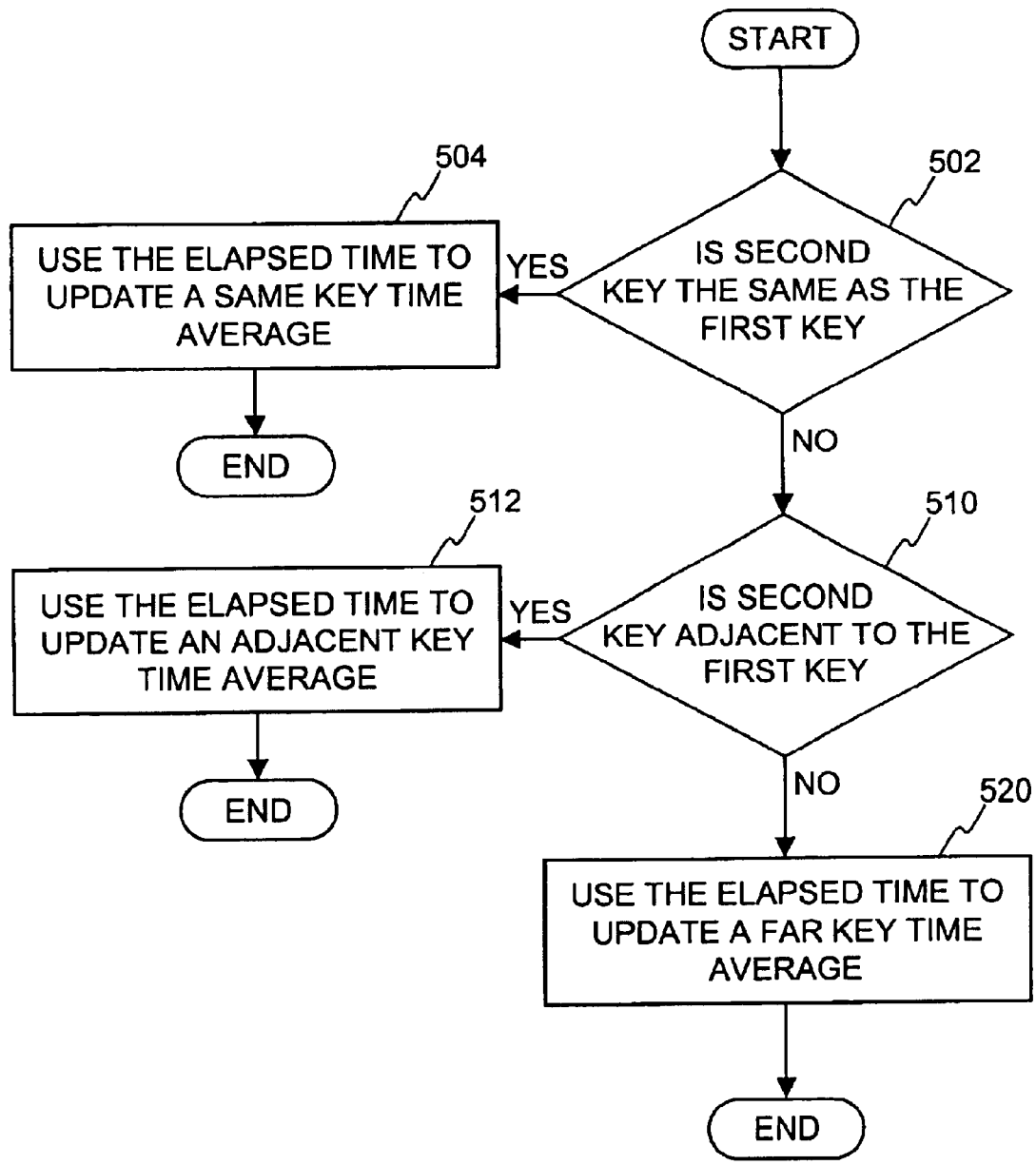
FIG. 5 shows one embodiment of determining the elapsed time.

FIG. 5 shows one embodiment of determining the elapsed time. Often the elapsed time between key selections varies because the user must move his finger from a first key to a second key. Therefore a simple average elapsed time between key selections may not be the most efficient for every key press. For example, if the first key and the second key are the same key, then the elapsed time between key selections is likely very short compared to the elapsed time if the first and second keys are far apart on the keypad i.e. where the first and second keys are separated by at least one or more other keys. FIG. 5 illustrates a method of differentiating between the different elapsed times that may occur. In block 502, if the first key and the second key are the same key, then the elapsed time is averaged into a same key elapsed time average value in block 504. If in block 502, the first key and the second key are not the same key, then the elapsed time is analyzed in block 510. If the first key and the second key are adjacent, in block 510, then the elapsed time is averaged into an adjacent key elapsed time average value in block 512. If the first key and the second key are not adjacent, in block 510, then the first key and the second key must be separated by at least one other key and are therefore considered distant or far keys. The elapsed time for far keys is averaged into a far key elapsed time average value in block 520.

In one embodiment the average time delays described above (i.e. the far key time average, the same key time average and the adjacent key time average) are calculated by using any of the well known averaging methods known in the art such as using a low pass filter or accumulating the corresponding time delay and dividing by the total number of the corresponding time delays.

Figure 6:
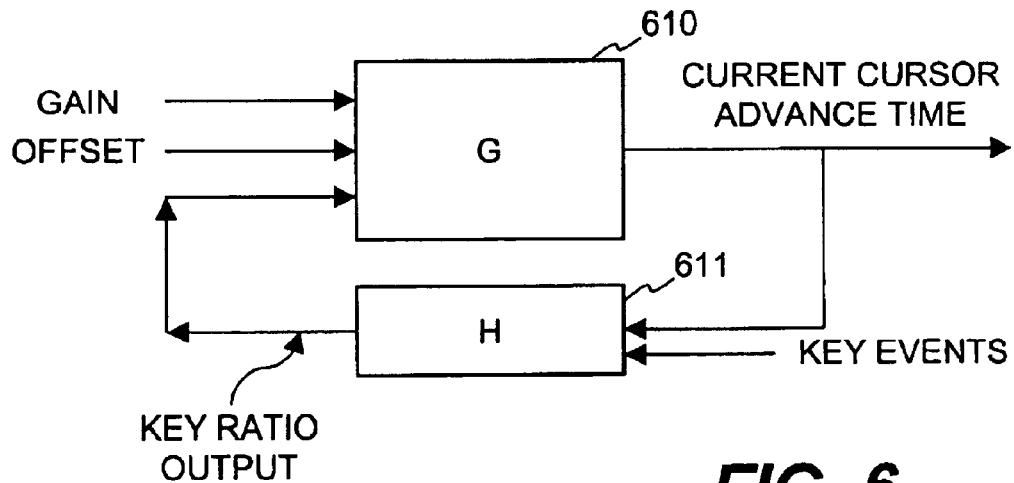
FIG. 6 shows one embodiment of a system for determining a current cursor advance time delay.

FIG. 6 shows one embodiment of a system for determining a current cursor advance time delay. FIG. 6 illustrates a closed loop control system diagram. One skilled in the art will recognize that a variety of methods could be used in the G function 610 and H function 611 such as proportional (P), proportional-integrative (PI) and proportional-integrative-derivative (PID) type control systems. Key events and an initial current cursor advance time are input into the H function 611. The key events include events such as the elapsed time between selecting a first and a second key. A key ratio is output from the H function 611 to the G function 610. Gain and offset values are also input to the G function 610. An updated current cursor advance time is output from G function 610.

Figure 6A:
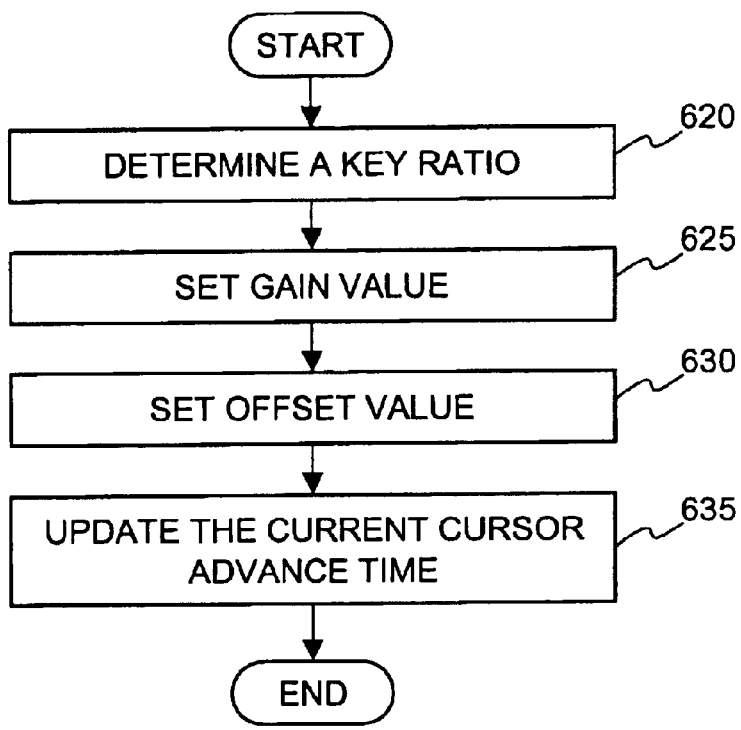
FIG. 6A illustrates one embodiment of updating the current cursor advance time delay.

FIG. 6A illustrates one embodiment of updating the current cursor advance time delay. First, a key ratio is determined at block 620. In one embodiment the key ratio is equal to the far key time average divided by the same key time average as described in FIG. 5 above. The key ratio can also include other factors such as offsets and one or more multipliers and combinations thereof. Next, in block 625, a gain value is set. An offset value is set in block 630. The current cursor advance time is updated in block 635. In one embodiment the updated current cursor advance time is equal to the sum of the offset plus the gain, multiplied by the key ratio. Alternatively, additional multipliers can also be added to increase or decrease the resulting updated current cursor advance time. Additional offsets can also be included to offset the resulting updated current cursor advance time.

In one embodiment, in an initial state, the key ratio is set to 1, the gain is set to 400 mSec and the offset is equal to 200 mSec so that an initial current cursor advance time will be equal to 1400 mSec. In one embodiment, the key ratio can be no less than 1. This limit is selected because the time to select a far key (i.e. the far key time average) should not drop below the time required to select the same key twice (i.e. the same key time average).

Figure 7:
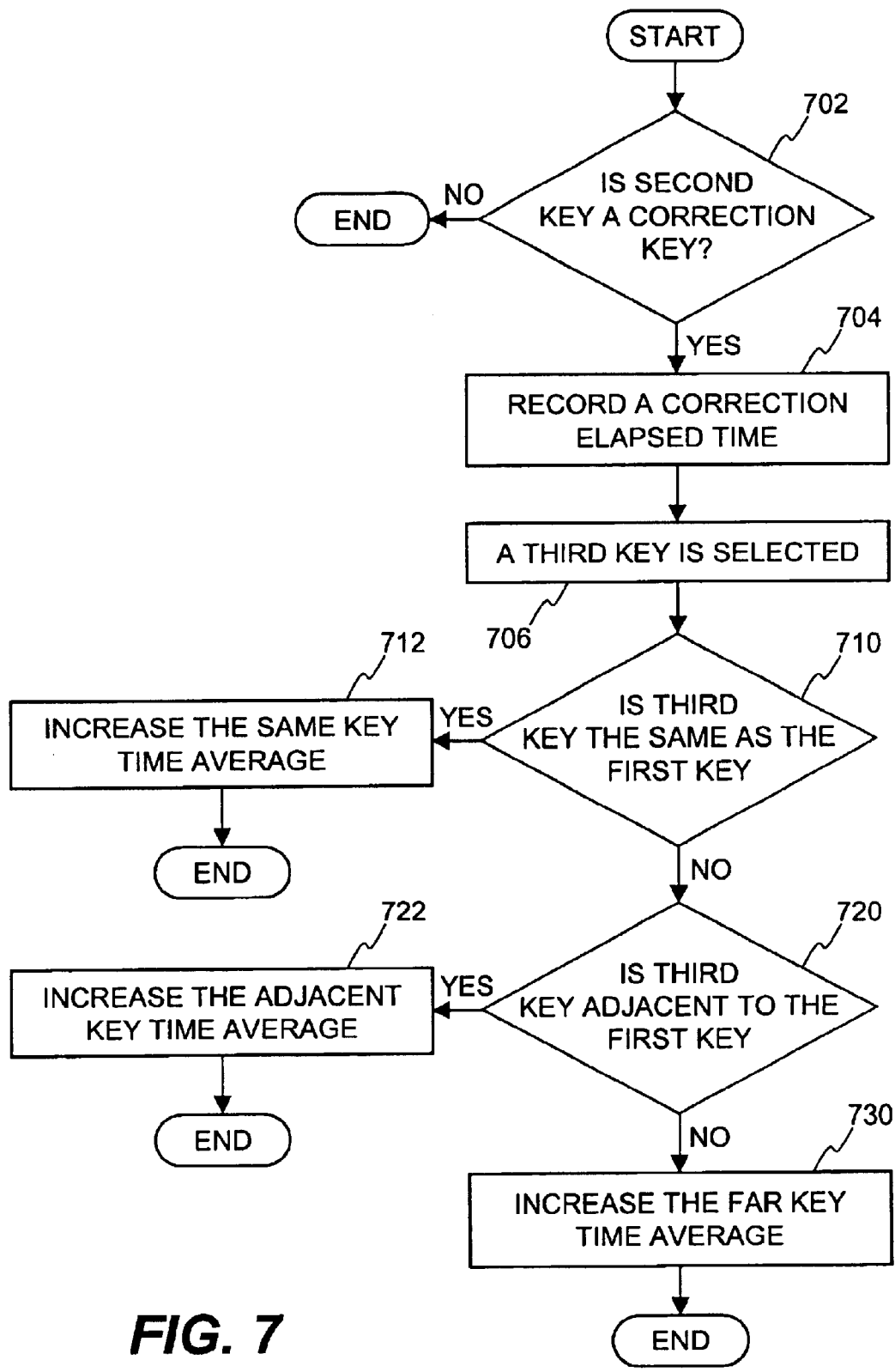
FIG. 7 illustrates one embodiment of correcting an erroneous first multi-tap key press.

FIG. 7 illustrates one embodiment of correcting an erroneous first multi-tap key selection. If the second key is a back space or other correction key used to cause the cursor to step back to the previous character entered in the previous (i.e. first) key selection. In one embodiment, if the second key is a correction key, then the elapsed time is a correction elapsed time. In one embodiment, the correction elapsed time is not averaged into any of the above-described average elapsed times. However, the correction elapsed time is recorded because if the as the correction elapsed time it is possible that the current cursor advance time delay is too short. As shown in FIG. 7, if the second key is a correction key, then a correction time is recorded in block 704. When a third key is selected in block 706, then the current cursor advance time delay is adjusted. In one embodiment, the increase is a set offset value such as 200 mSec, which is added to the current cursor advance time delay. In another embodiment the offset could be a percentage or another multiplier greater than one that is multiplied by the current cursor advance time delay.

In another embodiment the different averages are increased, depending on the type of the third key. For example as shown in blocks 710–730 of FIG. 7, if the third key is the same as the first key then the same key time average is increased. Alternatively, if the third key is the adjacent key, then the adjacent key time average is increased. Alternatively, if the third key is a far key, then the far key time average is increased. The increased average times (i.e. the same key time average, the adjacent key time average and the far key time average) are then processed as described above in FIGS. 3–6A to update the current cursor advance time delay.

Figure 8:
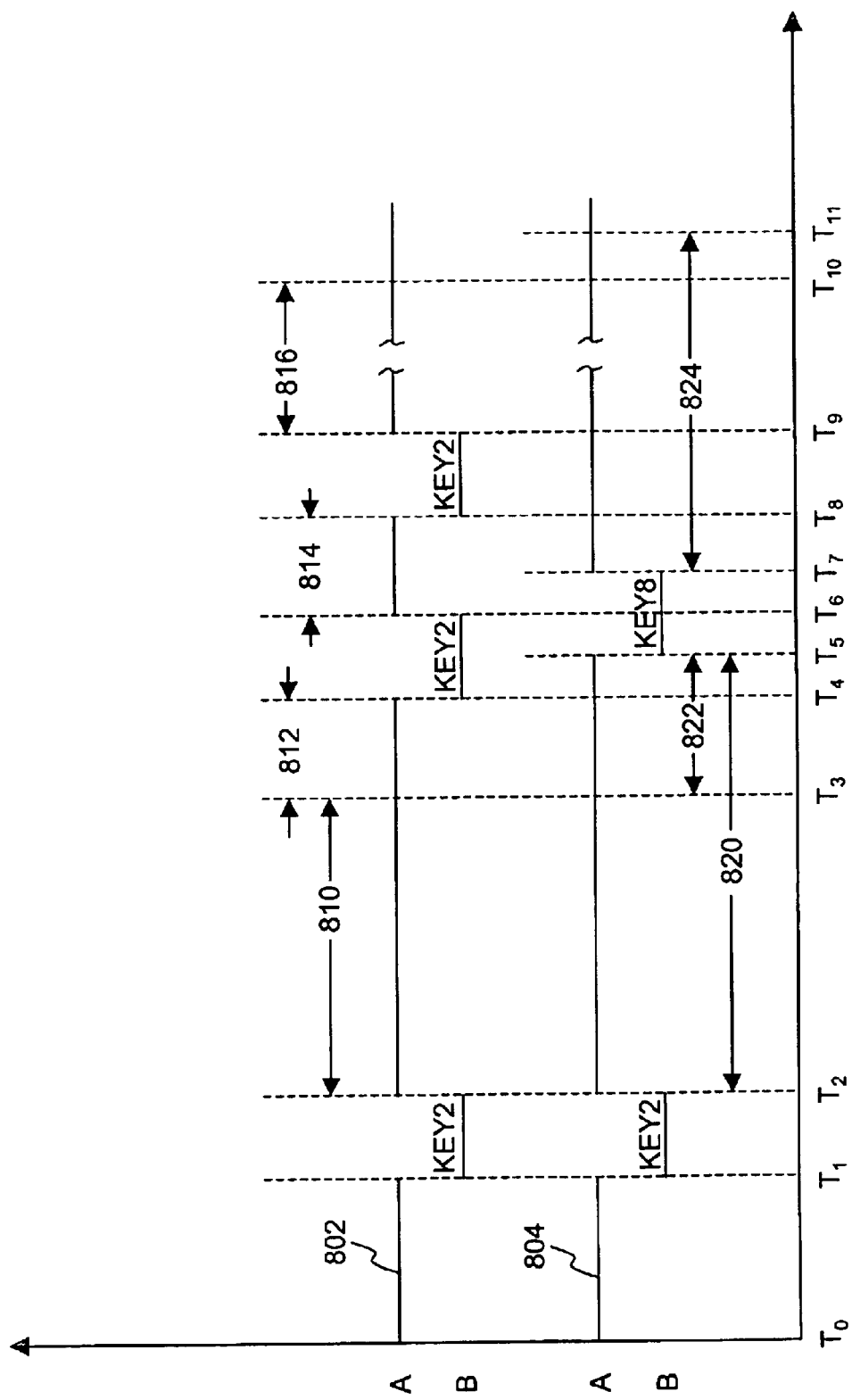
FIG. 8 illustrates two time traces of selecting keys in one embodiment.

FIG. 8 illustrates two time traces 802, 804 of selecting keys in one embodiment. The top trace 802 illustrates the timeline of selecting the same key twice. The second trace 804 illustrates the timeline of selecting two different keys. Trace 802 illustrates a selection of the "2, A, B, C" key (key "2") where a user desires to output an "AB". First, trace 802 shows a selection of key "2" at a time $T_1$, and release of key "2" at a time $T_2$. A first time interval 810 between times $T_2$ and $T_3$ represents the time waiting for the cursor to advance (i.e. such as the current cursor advance time delay as described above). At time $T_3$, an "A" is output and the cursor advances to the next cursor position. A second time interval 812, between times $T_3$ and $T_4$, represents the time required for a user to react to the cursor advance and select another key. In the case of trace 802, key "2" is selected again at time $T_4$ and released at time $T_6$. Key "2" is selected yet again after third time interval 814, at time $T_8$ and released at time $T_9$ so that a "B" is displayed. The second and third time intervals 812, 814 are substantially equal in duration and represent the time required for a user to select the same key (i.e. the same key time average as described above). The B will be output and the cursor advanced after fourth time interval 816 at time $T_{10}$. The fourth time interval 816 is substantially the same duration as the current cursor advance time delay.

Trace 804 shows a selection of the "2, A, B, C" key (key "2") and the "8, T, U, V" key (key "8") where a user desires to output an "AT". First, trace 804 shows a selection of key "2" at a time $T_1$, and release of key "2" at a time $T_2$. A first time interval 810 between times $T_2$ and $T_3$ represents the time waiting for the cursor to advance (i.e. such as the current cursor advance time delay as described above). At time $T_3$, an "A" is output and the cursor advances to the next cursor position. A fifth time interval 822, between times $T_3$ and $T_5$, represents the time required for a user to react to the cursor advance and select another key. In the case of trace 804, key "8" is selected at time $T_5$ and released at time $T_7$. The fifth time interval 822 is somewhat longer than the second time interval 812, described above, because the user selected a different key, key "8" which is a far key from key "2", rather selecting key "2" a second time. Therefore the user required some additional time (i.e. sixth time interval 820) to move his finger all the way from key "2" to key "8". The fifth time interval 822 is substantially equal to the far key time average described above. The "T" will be output and the cursor advanced after seventh time interval 824, at time $T_{11}$. The seventh time interval 824 is substantially the same duration as the current cursor advance time delay.

In one extreme upset case where the current cursor advance time delay is very large (i.e. 5 seconds or more) then the users in both traces 802 and 804 will be waiting an extended time for the cursor to advance. In such a case, the far key time average and the same key time average will be substantially identical. Therefore the key ratio will be substantially equal to 1.0. When the key ratio is equal to 1.0, then the current cursor advance time delay is too long. In one embodiment, when the ratio is equal to 1.0, then the current cursor advance time delay is reset to the start values described above, i.e. gain=400 mSec and offset=200 mSec. Then the current cursor advance time delay will be adjusted as described above in FIGS. 6–7.

In another embodiment, if the current cursor advance time delay is very short (such as 200 mSec) then the user in trace 802 may be still ready, to select the key "2" a second time because he is selecting the same key and the same key time average is also very short, perhaps 200 mSec. The user represented in trace 804 however, will not be ready and the far key time average could jump to over 1000 mSec. The key ratio could then jump to 5.0. Such as high key ratio indicates the current cursor advance time delay is too short. The cursor will therefore advance while the user is attempting to multi-tap his first selection ("A", "B", or "C" in this example). In one embodiment, when the ratio is equal to 5.0, then the current cursor advance time delay is reset to the start values described above, i.e. gain=400 mSec and offset=200 mSec resulting in a current cursor advance time delay of 2.2 seconds. Then the current cursor advance time delay will be adjusted as described above in FIGS. 6–7.

Figure 9:
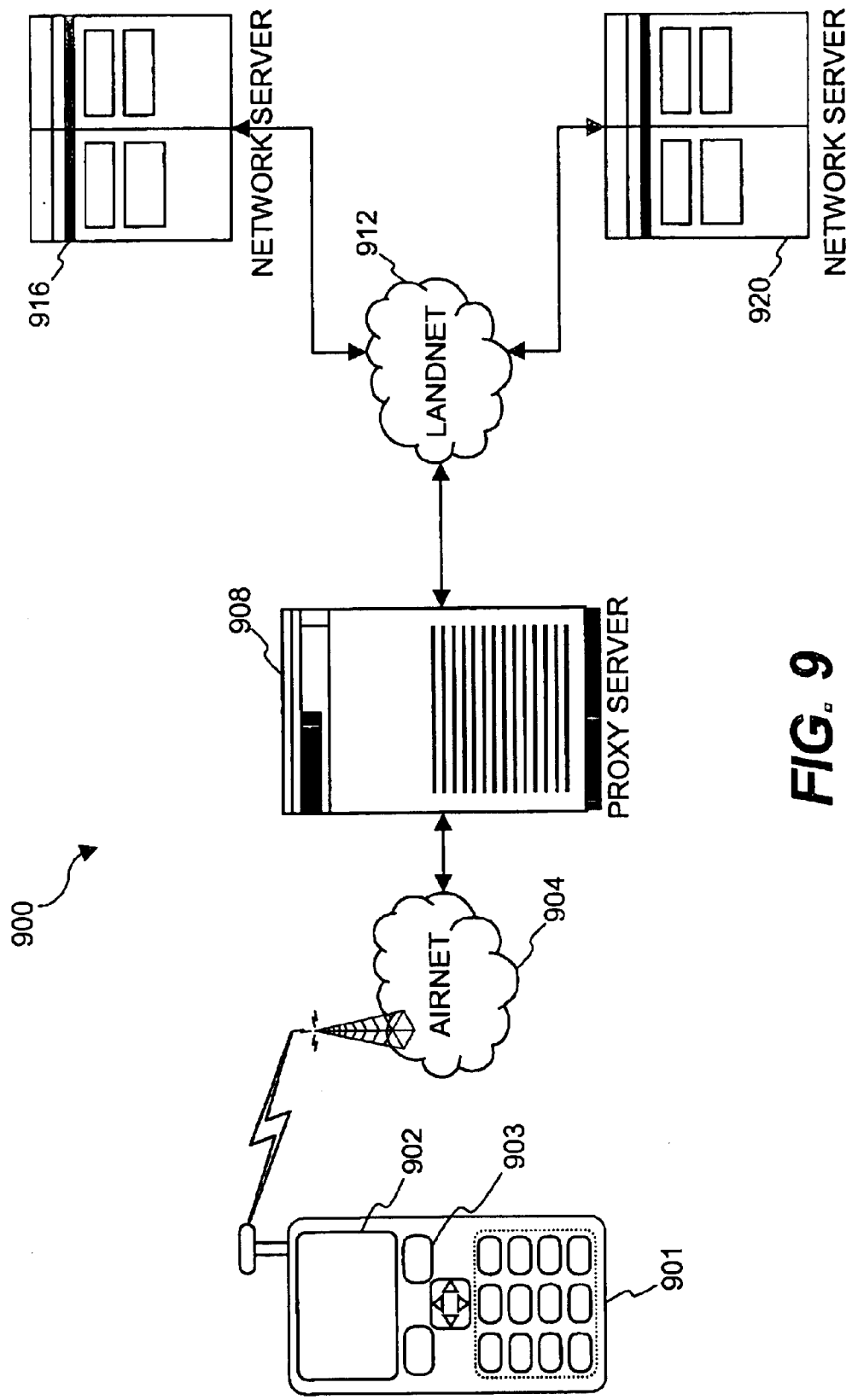
FIG. 9 shows one embodiment of a network environment.

FIG. 9 shows one embodiment of a network environment in which a wireless communication device (or simply "wireless device"), such as described in FIG. 2 above, can be used. Wireless device 900 may be of any of the types of wireless devices mentioned above, such as a wireless telephone. To facilitate explanation, the example of a wireless telephone is used at various points in the following description. As described herein, wireless device 901 is enabled to receive remotely stored hypermedia information, such as Wireless Markup Language (WML) documents, HTML documents, Compact HTML (cHTML) documents, Extensible Markup Language (XML) documents, or Handheld Device Markup Language (HDML) documents, from one or more network servers, shown as network servers 916 and 920. Network Servers 916 and 920 may be, for example, conventional server-class computers, personal computers (PCs) or computer workstations. Wireless device 901 has a display 902 and a keypad 903. The wireless device 901 can include a micro-browser capable of accessing and displaying hypermedia content, such as WML cards, HTML pages, or the like.

The communication path between wireless device 901 and network servers 916 and 920 includes a wireless communication network ("airnet") 904, a proxy server 908, and a land-based network ("landnet") 912. Airnet 904 is a network such as a Cellular Digital Packet Data (CDPD) network, a Global System for Mobile (GSM) network, a Code Division Multiple Access (CDMA) network, or a Time Division Multiple Access Network (TDMA) network. The communications protocols used by airnet 904 may include, for example, WAP, HDTP, Transmission Control Protocol (TCP/IP), HTTP, and/or SSL+HTTP (HTTP over secure sockets layer (SSL)). Landnet 912 is a land-based network that may be or include the Internet, an intranet, or a data network of any private network, such as a Local Area Network (LAN). The communication protocol supporting landnet 912 may be, for example, TCP/IP, HTTP, or HTTP over SSL.

Proxy server 908 acts as a bridge between airnet 904 and landnet 912. Proxy server 908 may be, for example, a conventional computer workstation or PC. Although shown as a physically separate device, proxy server 908 may be implemented in a network server (e.g. network servers 916 or 920) with hardware and software such as well known in the art providing the connection between airnet 904 and landnet 912. Proxy server 908 can be substantially the same as network servers 916 and 920, except that it also includes features of the present invention described herein.

Figure 10:
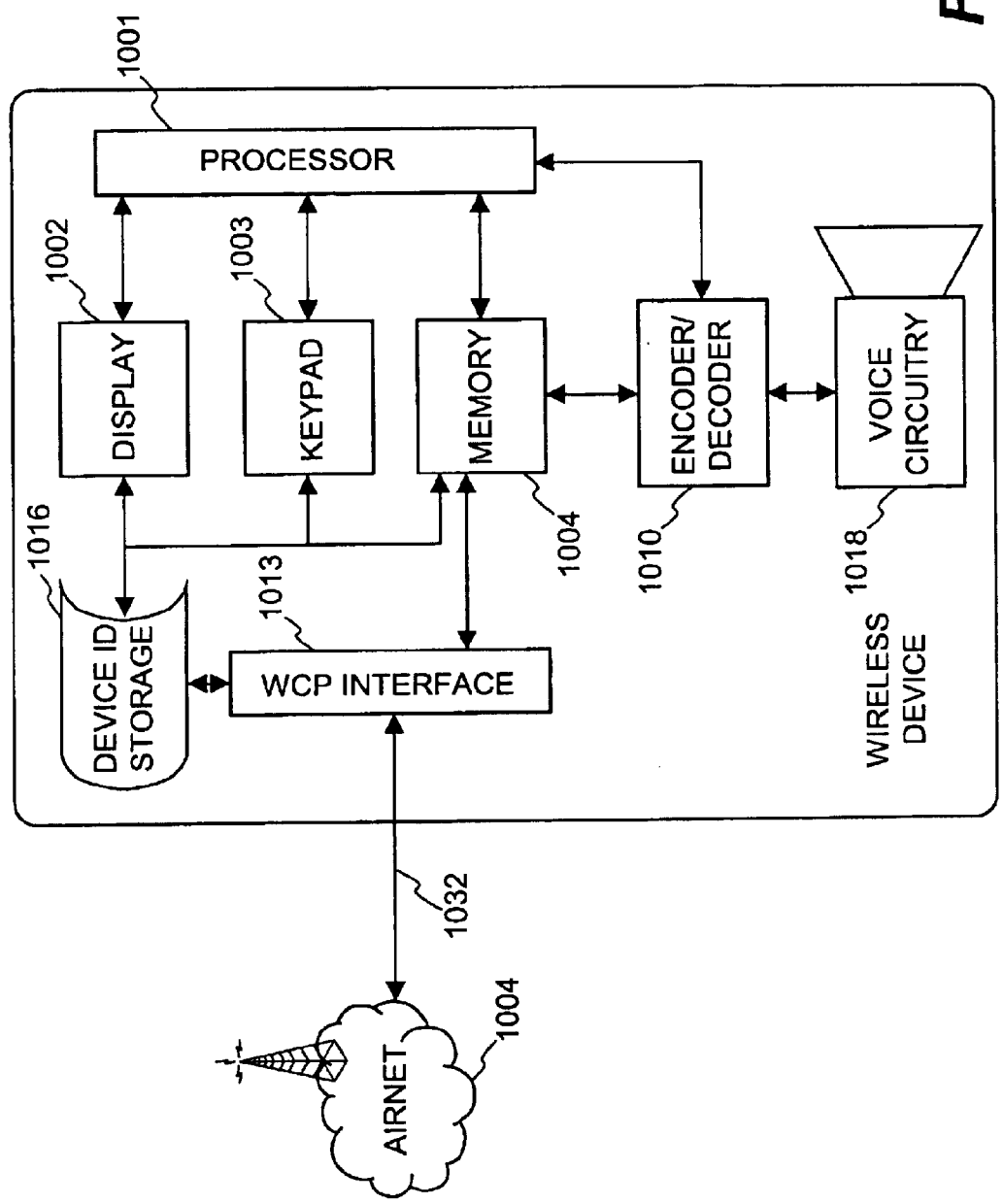
FIG. 10 is a block diagram showing the principle components of wireless device of one embodiment.

FIG. 10 is a block diagram showing the principle components of wireless device 1000 of one embodiment. The wireless device 1000 includes a processor 1001, which may be or may include any of: a general or special purpose programmable microprocessor, Digital Signal Processor (DSP), Application Specific Integrated Circuit (ASIC), Programmable Logic Array (PLA), Field Programmable Gate Array (FPGA), etc., or a combination thereof. Wireless device 1000 includes a Wireless Control Protocol (WCP) interface 1013 that couples to a carrier network via airnet 1004 to receive incoming and outgoing signals. Device identifier (ID) storage 1016 stores and supplies to WCP interface 1013 a Mobile Device Identifier (MIN), which identifies wireless device 1000 to outside entities (e.g. proxy server 908 a client, a server, or other network device). The MIN is a specific code that is associated with wireless device 1000 and directly corresponds to a device ID in a user account typically provided in an associated proxy server, such as proxy server 908. If the proxy server services a number of wireless devices, there will be a number of such accounts, preferably kept in a database server, each of the accounts corresponding to a different one of the wireless devices.

In addition, wireless device 1000 includes memory 1004 that stores data and/or software for controlling and/or performing many of the processing tasks performed by wireless device 1000. These tasks include: establishing a communication session with a proxy server via wireless link 1032 and airnet 1004; receiving user inputs from keypad 1003, and displaying information on the display 1002. Hence, memory 1004 may represent one or more physical memory devices or facilities, which may include any type of Random Access Memory (RAM), read-only Memory (ROM) (which may be programmable), flash memory, non-volatile mass storage device, or a combination of such memory devices. Memory 1004 is also coupled to WCP interface 1013 for the establishment of a communication session and the requesting and receiving of data.

Assuming, for example, that wireless device is a telephone, wireless device 1000 also includes voice circuitry 1018 for inputting and outputting audio during a telephonic communication between the user of wireless device 1000 and a remote party. Voice circuitry 1018 may include, for example, sound transducers, analog-to-digital (A/D) and digital-to-analog (D/A) converters, filters, etc., such as are well-known in the art. An encoder/decoder 1010 is coupled between the processor 1001 and the voice circuitry 1018 for encoding and decoding audio signals.

Figure 11:
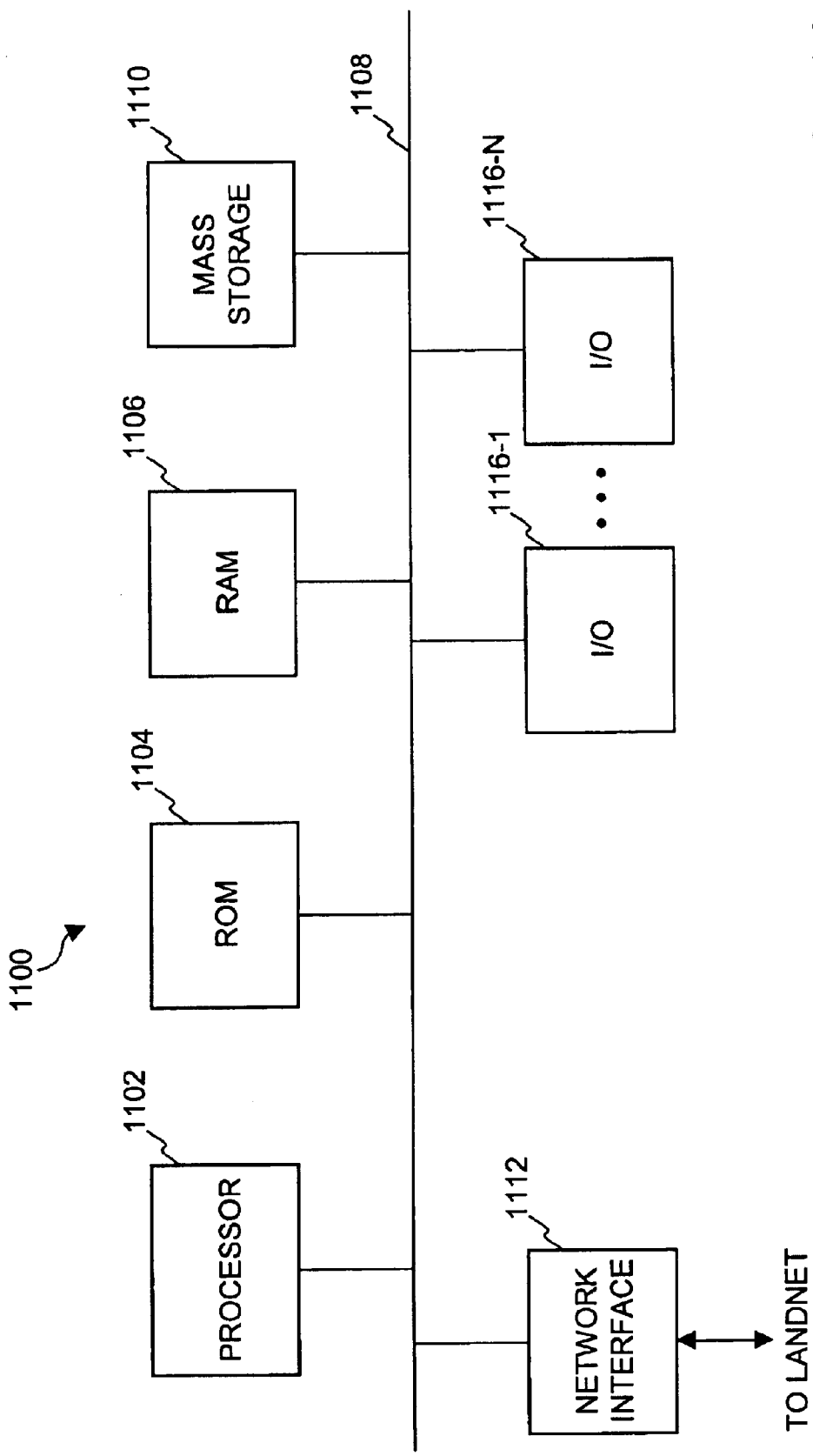
FIG. 11 is a high-level block diagram of a computer system representative of a servers or other computer system of one embodiment.

FIG. 11 is a high-level block diagram of a computer system representative of any or all of the servers shown in FIG. 9, i.e., proxy server 908 and network servers 916 and 920. As shown, the computer system includes a processor 1102, ROM 1104, and RAM 1106, each connected to a bus system 1108. The bus system 1108 may include one or more buses connected to each other through various bridges, controllers and/or adapters, such as are well-known in the art. For example, the bus system 1108 may include a "system bus" that is connected through an adapter to one or more expansion buses, such as a Peripheral Component Interconnect (PCI) bus. Also coupled to the bus system 1108 are a mass storage device 1110, a network interface 1112, and a number (N) of input/output (I/O) devices 1116-1 through 1116-N.

I/O devices 1116-1 through 1116-N may include, for example, a keyboard, a pointing device, a display device and/or other conventional I/O devices. Mass storage device 1110 may include any suitable device for storing large volumes of data, such as a magnetic disk or tape, magneto-optical (MO) storage device, or any of various types of Digital Versatile Disk (DVD) or Compact Disk (CD) based storage.

Network interface 1112 provides data communication between the computer system and other computer systems such as on the landnet 912 or on the airnet 904 of FIG. 9. Hence, network interface 1112 may be any device suitable for or enabling the computer system 1100 to communicate data with a remote processing system over a data communication link, such as a conventional telephone modem, an Integrated Services Digital Network (ISDN) adapter, a Digital Subscriber Line (DSL) adapter, a cable modem, a satellite transceiver, an Ethernet adapter, or the like.

Of course, many variations upon the architecture shown in FIG. 11 can be made to suit the particular needs of a given system. Thus, certain components may be added to those shown in FIG. 11 for given system, or certain components shown in FIG. 11 may be omitted from the given system.

It will be further appreciated that the instructions represented by the blocks in FIGS. 3–7 are not required to be performed in the order illustrated, and that all the processing represented by the blocks may not be necessary to practice the invention.

Given this description, one skilled in the art will readily appreciate that the described techniques can be practiced with other computer system configurations, including multiprocessor systems, minicomputers, mainframe computers, and the like. It will also be appreciated that any of a variety of programming languages may be used to implement the embodiments as described herein. Furthermore, it is common in the art to speak of software, in one form or another (e.g., program, procedure, process, application, module, logic . . . ), as taking an action or causing a result. Such expressions are merely a shorthand way of saying that execution of the software by a computer causes the processor of the computer to perform an action or produce a result. It will also be appreciated that the above-described processes can be implemented in software or hardwired in a computer system or combinations thereof. Therefore, the description of any of the embodiments described herein is not limited to any particular combination of hardware and/or software.

If written in a programming language conforming to a recognized standard, such instructions can be executed on a variety of hardware platforms and for interface to a variety of operating systems. In addition, the present invention is not described with reference to any particular programming language. It will be appreciated that a variety of programming languages may be used to implement the teachings of the invention as described herein. One of skill in the art will also immediately recognize that the term "computer-readable medium/media" further encompasses a carrier wave that encodes a data signal.

In the foregoing specification, the invention has been described with reference to specific exemplary embodiments thereof. It will be appreciated that various modifications may be made thereto without departing from the broader spirit and scope of the invention as set forth in the following claims. The specification and drawings are, accordingly, to be regarded in an illustrative sense rather than a restrictive sense.

What is claimed is:

1. A method of determining a dynamic cursor advance time delay comprising:

measuring an elapsed time between a selection of a first key and a selection of a second key;

comparing the measured elapsed time to a current cursor advance time delay; and adjusting the current cursor advance time delay.

2. The method of claim 1, wherein measuring an elapsed time between a selection of a first key and a selection of a second key includes averaging the elapsed time with a plurality of previously recorded elapsed times.

3. The method of claim 2, wherein averaging the elapsed time with a plurality of previously recorded elapsed times includes:

determining if the first key and the second key are the same key; and if the first key and the second key are the same key, then using the elapsed time to update a same key time average.

4. The method of claim 3, wherein updating the same key time average includes applying a low pass filter to the elapsed time.

5. The method of claim 2, wherein averaging the elapsed time with a plurality of previously recorded elapsed times includes:

determining if the first key and the second key are not adjacent keys and not the same key; and if the first key and the second key are not adjacent keys and not the same key, then using the elapsed time to update a far key time average.

6. The method of claim 5, wherein updating the far key time average includes applying a low pass filter to the elapsed time.

7. The method of claim 2, wherein averaging the elapsed time with a plurality of previously recorded elapsed times includes:

determining if the first key and the second key are adjacent keys; and if the first key and the second key are adjacent keys, then using the elapsed time to update an adjacent key time average.

8. The method of claim 7, wherein updating the adjacent key time average includes applying a low pass filter to the elapsed time.

9. The method of claim 1, wherein adjusting the current cursor advance time delay includes:

determining a key ratio;

setting a gain value;

setting an offset value; and updating the current cursor advance time.

10. The method of claim 9, wherein updating the current cursor advance time includes at least one of a group of functions consisting of a proportional control, a proportional-integrative control, and a proportional-integrative-derivative control.

11. The method of claim 9, wherein updating the current cursor advance time includes setting the current cursor advance time to a value equal to a sum of the offset plus the gain, multiplied by the key ratio.

12. The method of claim 9, wherein updating the current cursor advance time includes setting the current cursor advance time to a value equal to a sum of the offset plus the gain, multiplied by the key ratio.

13. The method of claim 1, wherein adjusting the current cursor advance time delay includes:
determining if the second key is a correction key; and
if the second key is a correction key, then:
determining a correction elapsed time wherein the correction elapsed time is the time elapsed between when the correction key was selected and when a third key is selected.

14. The method of claim 13, wherein adjusting the current cursor advance time delay further includes:
determining if the third key is the same as the first key; and
if the third key is the same as the first key, then:
increasing a same key time average.

15. The method of claim 13, wherein adjusting the current cursor advance time delay further includes:
determining if the third key is a far key from the first key; and
if the third key is a far key from the first key, then:
increasing a far key time average.

16. The method of claim 13, wherein adjusting the current cursor advance time delay further includes:
determining if the third key is adjacent to the first key; and
if the third key is adjacent to the first key, then:
increasing an adjacent key time average.

17. A method of determining a dynamic cursor advance time delay comprising:
measuring an elapsed time between a selection of a first key and a selection of a second key;
averaging the elapsed time with a plurality of previously recorded elapsed times;
comparing the measured elapsed time to a current cursor advance time delay; and
adjusting the current cursor advance time delay including:
determining a key ratio;
setting a gain value;
setting an offset value; and
setting the current cursor advance time to a value equal to a sum of the offset plus the gain, multiplied by the key ratio.

18. An apparatus for system for determining a dynamic cursor advance time delay comprising:
a processor; and
a storage facility coupled to the processor and containing instructions executable by the processor which configure the processor to:
measure an elapsed time between a selection of a first key and a selection of a second key;
compare the measured elapsed time to a current cursor advance time delay; and
adjust the current cursor advance time delay.

19. The apparatus of claim 18, wherein a user terminal includes the processor and the storage facility and a keypad including a plurality of multi-tap keys.

20. The apparatus of claim 19, wherein the user terminal is coupled to a network.

21. The apparatus of claim 20, wherein the network includes at least one of a group consisting of a wireless application protocol (WAP), an Internet, an intranet, a local area network (LAN) and a wide area network (WAN).

22. The apparatus of claim 19, wherein the user terminal includes at least one of a group consisting of a personal digital assistant (PDA), a telephone, a cellular telephone, a two-way pager, and a computer.

23. An apparatus for determining a dynamic cursor advance time delay comprising:
means for measuring an elapsed time between a selection of a first key and a selection of a second key;
means for comparing the measured elapsed time to a current cursor advance time delay; and
means for adjusting the current cursor advance time delay.

24. A telephone comprising:
a voice circuit;
a processor;
a plurality of input/output devices coupled to the processor, wherein the processor is coupled to a network via at least one of the plurality of input/output devices;
a plurality of multi-tap keys coupled to the processor;
a display coupled to the processor wherein the display includes:
a cursor; and
a plurality of cursor positions; and
a storage facility coupled to the processor and containing instructions executable by the processor which configure the processor to:
measure an elapsed time between a selection of a first multi-tap key and a selection of a second multi-tap key;
compare the measured elapsed time to a current cursor advance time delay; and
adjust the current cursor advance time delay.

25. A pager comprising:
a processor;
a plurality of input/output devices coupled to the processor, wherein the processor is coupled to a network via at least one of the plurality of input/output devices;
a plurality of multi-tap keys coupled to the processor;
a display coupled to the processor wherein the display includes:
a cursor; and
a plurality of cursor positions; and
a storage facility coupled to the processor and containing instructions executable by the processor which configure the processor to:
measure an elapsed time between a selection of a first multi-tap key and a selection of a second multi-tap key;
compare the measured elapsed time to a current cursor advance time delay; and
adjust the current cursor advance time delay.

26. A display device comprising:
a processor;
a plurality of multi-tap keys coupled to the processor;
a display coupled to the processor wherein the display includes:
a cursor; and
a plurality of cursor positions; and
a storage facility coupled to the processor and containing instructions executable by the processor which configure the processor to:
measure an elapsed time between a selection of a first multi-tap key and a selection of a second multi-tap key;
compare the measured elapsed time to a current cursor advance time delay; and
adjust the current cursor advance time delay.

* * * * *